United States Patent
Yamazaki et al.

(10) Patent No.: US 6,902,949 B2
(45) Date of Patent: Jun. 7, 2005

(54) MULTI-LAYER WIRING CIRCUIT BOARD AND METHOD FOR PRODUCING THE SAME

(75) Inventors: Hiroshi Yamazaki, Ibaraki (JP); Mineyoshi Hasegawa, Ibaraki (JP); Satoshi Tanigawa, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/109,680

(22) Filed: Apr. 1, 2002

(65) Prior Publication Data

US 2002/0140076 A1 Oct. 3, 2002

(30) Foreign Application Priority Data

Apr. 2, 2001 (JP) .................................... P2001-102896

(51) Int. Cl.[7] ............................................. H01L 21/44
(52) U.S. Cl. ................. 438/106; 438/107; 438/110; 438/118; 438/125; 438/209; 174/254; 174/259; 361/752
(58) Field of Search ................. 438/106, 107, 438/110, 118, 125, 209; 174/254, 259; 361/752

(56) References Cited

U.S. PATENT DOCUMENTS

| | | | | |
|---|---|---|---|---|
| 4,012,307 A | * | 3/1977 | Phillips | 204/192 |
| 4,800,461 A | * | 1/1989 | Dixon et al. | 361/751 |
| 4,915,983 A | * | 4/1990 | Lake et al. | 427/98 |
| 4,931,134 A | * | 6/1990 | Hatkevitz et al. | 216/17 |
| 5,072,074 A | * | 12/1991 | DeMaso et al. | 174/254 |
| 5,121,297 A | | 6/1992 | Haas | |
| 5,449,480 A | * | 9/1995 | Kuriya et al. | 264/112 |
| 5,798,563 A | * | 8/1998 | Feilchenfeld et al. | 257/668 |
| 6,099,745 A | * | 8/2000 | McKenney et al. | 216/13 |
| 6,162,996 A | * | 12/2000 | Schmidt et al. | 174/259 |
| 6,288,343 B1 | * | 9/2001 | Ahn et al. | 174/254 |
| 6,350,387 B2 | * | 2/2002 | Caron et al. | 216/20 |
| 6,423,581 B1 | * | 7/2002 | Brand | 438/125 |
| 2001/0010303 A1 | * | 8/2001 | Caron et al. | 216/18 |

FOREIGN PATENT DOCUMENTS

| | | |
|---|---|---|
| CN | 1136758 A | 12/1995 |
| EP | 0 744 884 A2 | 11/1996 |

* cited by examiner

*Primary Examiner*—Bradley Baumeister
*Assistant Examiner*—Victor V Yevsikov
(74) *Attorney, Agent, or Firm*—Sughrue Mion, PLLC (57) ABSTRACT

First and second metal foil layers are laminated on opposite surfaces of a first insulating layer to form a first board. Then, the first and second metal foil layers are formed into predetermined conductor patterns respectively. Then, second and third insulating layers of second and third boards formed separately from the first board are laminated on the first and second metal foil layers through first and second adhesive layers respectively. Then, a thin layer portion is removed and thick layer portions are formed into predetermined conductor patterns respectively in third and fourth metal foil layers of the second and third boards.

27 Claims, 3 Drawing Sheets

MULTI-LAYER WIRING CIRCUIT BOARD AND METHOD FOR PRODUCING THE SAME

BACKGROUND OF THE INVENTION

1. Field of the Invention

The present invention relates to a multi-layer wiring circuit board and a method for producing the same, and particularly to a multi-layer wiring circuit board having thick layer portions and thin layer portions and a method for producing the same.

2. Related Art

Figure 3A:
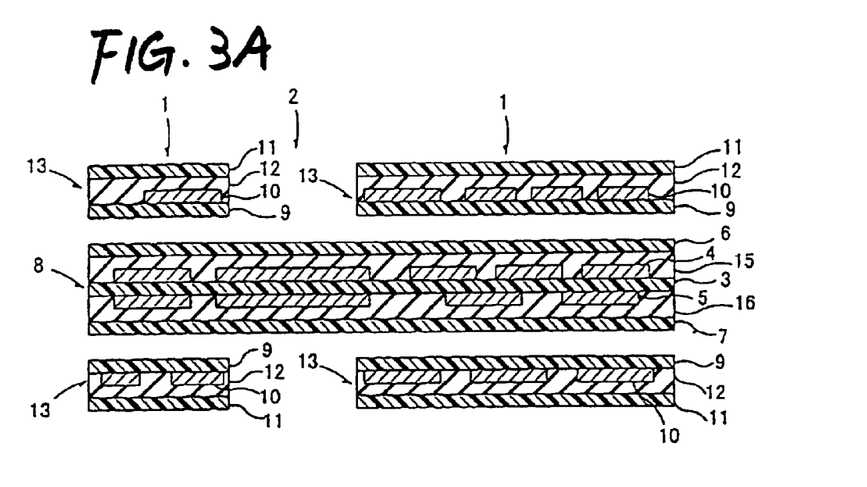
FIG. 3A showing the step of forming first and second boards.
Figure 3B:
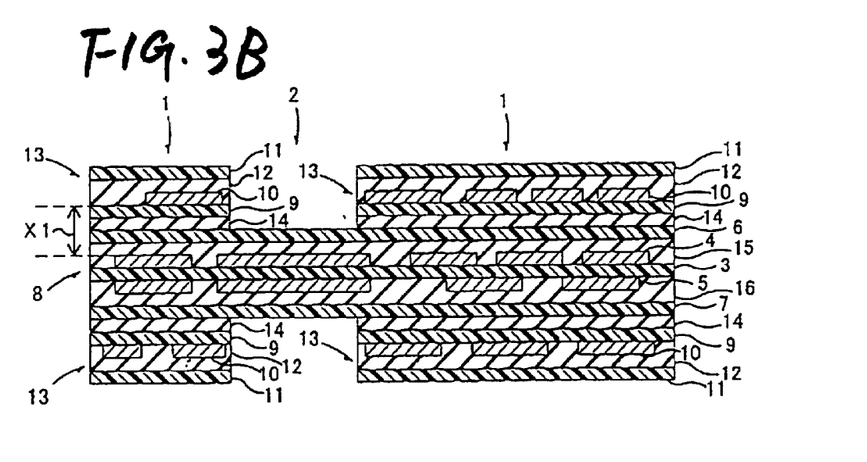
FIG. 3B showing the step of laminating respective second boards on rigid wiring circuit portion-forming portions of the first board through fourth adhesive layers respectively.

Heretofore, a rigid flexible wiring circuit board has been used widely in a portable electronic appliance or the like because reduction in size and weight of the rigid flexible wiring circuit board and increase in density thereof can be attained. As shown in FIG. 3B, the rigid flexible wiring circuit board has a rigid wiring circuit portions 1, and a flexible wiring circuit portion 2. Electronic parts can be mounted on each rigid wiring circuit portion 1 to thereby carry out high-density wiring in the rigid wiring circuit portion 1. The flexible wiring circuit portion 2 is flexible so as to be foldable and is formed as a signal transmission path.

Such a rigid flexible wiring circuit board can be produced as follows. That is, as shown in FIG. 3A, a double-sided substrate in which first and second conductive layers 4 and 5 are laminated on opposite surfaces of a first insulating layer 3 is prepared so that second and third insulating layers 6 and 7 are laminated on the first and second conductive layers 4 and 5 of the double-sided substrate through first and second adhesive layers 15 and 16 respectively. Thus, a first board 8 is formed.

Then, a two-layered substrate in which a third conductive layer 10 is laminated on a fourth insulating layer 9 is prepared separately so that a cover insulating layer 11 for covering the third conductive layer 10 of the two-layered substrate is laminated on the third conductive layer 10 through a third adhesive layer 12. In such a manner, a plurality of second boards 13 are formed.

Further, as shown in FIG. 3B, the fourth insulating layers 9 of the respective second boards 13 are laminated on portions forming the rigid wiring circuit portions 1 in the second and third insulating layers 6 and 7 of the first board 8 through fourth adhesive layers 14 respectively. Thus, a rigid flexible wiring circuit is obtained.

In recent years, portable information communication apparatus such as cellular phone has been evolved into multi-function mobile apparatus having a camera function or the like as well as a related art telephone function. Accordingly, the demand for reduction in size and weight of a multi-layer wiring circuit board has been intensified. Also in the rigid flexible wiring circuit board, a rigid wiring circuit portion thereof is required to have a smaller thickness.

SUMMARY OF THE INVENTION

The invention is devised to solve the problem, and an object of the invention is to provide a multi-layer wiring circuit board in which a multi-layer region allowed to be subjected to high-density wiring is made thinner so that the multi-layer wiring circuit board can be made more compact, and to provide a method for producing the same.

In order to achieve the object, the multi-layer wiring circuit board according to the invention has: at least one first wiring circuit board made of a laminate of at least one conductive layer and at least one insulating layer; and at least one second wiring circuit board including at least one conductive layer and laminated on a partial region of the first wiring circuit board; wherein only one insulating layer is interposed between an outermost conductive layer of the first wiring circuit board and a nearest conductive layer of the second wiring circuit board to the outermost conductive layer.

Further, in the multi-layer wiring circuit board, preferably, the insulating layer interposed between the outermost conductive layer and the nearest conductive layer may serve also as an adhesive layer for bonding the outermost conductive layer and the nearest conductive layer to each other.

Further, in the multi-layer wiring circuit board, preferably, the at least one second wiring circuit board may be laminated on each of opposite surfaces of the first wiring circuit board. Further, preferably, the first wiring circuit board may include two conductive layers whereas each second wiring circuit board may include one conductive layer.

Further, according to the invention, there is provided a method of producing a multi-layer wiring circuit board, including the steps of: forming a first laminate of at least one conductive layer and at least one insulating layer so that at least one of surface layers of the first laminate is a conductive layer; forming a second laminate of at least one conductive layer and at least one insulating layer separately from the first laminate so that at least one of surface layers of the second laminate is an insulating layer; laminating the conductive layer forming the surface layer of the first laminate on the insulating layer forming the surface layer of the second laminate; and removing at least the conductive layer of the second laminate laminated on the insulating layer forming the surface layer of the second laminate in a partial region to thereby expose the insulating layer forming the surface layer of the second laminate.

In the method, preferably, the second laminate may be laminated on each of opposite surfaces of the first laminate. In addition, preferably, the first laminate may have two conductive layers whereas each second laminate may have one conductive layer.

Further, according to the invention, there is provided a method of producing a multi-layer wiring circuit board, including the steps of: forming a first board by laminating a first metal foil layer on one surface of a first insulating layer and a second metal foil layer on the other surface; forming the first and second metal foil layers into predetermined conductor patterns respectively; forming a second board by laminating a third metal foil layer on one surface of a second insulating layer and forming a third board by laminating a fourth metal foil layer on one surface of a third insulating layer; laminating the second insulating layer of the second board on the first metal foil layer of the first board through a first adhesive layer and laminating the third insulating layer of the third board on the second metal foil layer of the first board through a second adhesive layer; and removing a partial region of the third and fourth metal foil layers and forming residual regions except for the removed partial region into predetermined conductor patterns respectively.

Further, according to the invention, there is provided a method of producing a multi-layer wiring circuit board, comprising the steps of: forming a first board by laminating a first metal foil layer on one surface of a first insulating layer and a second metal foil layer on the other surface; forming the first and second metal foil layers into predetermined conductor patterns respectively; forming a second board by laminating a third metal foil layer on one surface of a second insulating layer serving also as an adhesive layer and forming a third board by laminating a fourth metal foil layer on one surface of a third insulating layer serving also as an adhesive layer; laminating the second insulating layer serving also as the adhesive layer of the second board onto the first metal foil layer of the first board and laminating the third insulating layer serving also as the adhesive layer of the third board onto the second metal foil layer of the first board; and removing a partial region of the third and fourth metal foil layers and forming residual regions except for the removed partial region into predetermined conductor patterns respectively.

BRIEF DESCRIPTION OF THE DRAWINGS

FIGS. 1A to 1G are main part sectional views showing steps in a method for producing a flexible multi-layer wiring circuit board;

FIGS. 2A to 2G are main part sectional views showing steps in another method for producing a flexible multi-layer wiring circuit board;

FIGS. 3A and 3B are main part sectional views showing steps in a related-art method of producing a rigid flexible wiring circuit board;

DETAILED DESCRIPTION OF THE PREFERRED EMBODIMENTS

A method for producing a flexible multi-layer wiring circuit board will be described below as an embodiment of a method for producing a flexible multi-layer wiring circuit board according to the invention with reference to FIGS. 1A to 1G and FIGS. 2A to 2G.

In this method, first, at least one conductive layer 21 and at least one insulating layer 22 are laminated to form a first laminate 23. In the first laminate 23, at least one of the surface layers is the conductive layer 21.

Figure 1A:
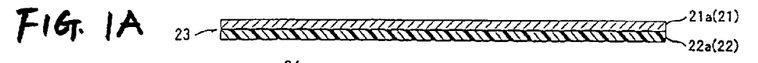
FIG. 1A showing the step of forming a first insulating layer on one surface of a first metal foil layer.
Figure 1B:
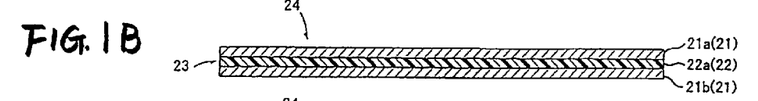
FIG. 1B showing the step of laminating a second metal foil layer on the other surface of the first insulating layer.
Figure 1C:
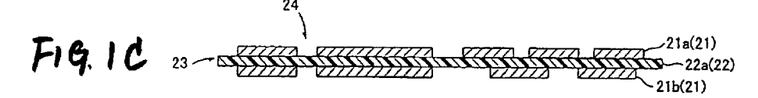
FIG. 1C showing the step of forming the first and second metal foil layers into predetermined conductor patterns respectively.

The first laminate 23 maybe formed as follows. As shown in FIG. 1A, a first insulating layer 22a is prepared so that a first metal foil layer 21a is laminated on one of opposite surfaces of the first insulating layer 22a. As shown in FIG. 1B, a second metal foil layer 21b is laminated on the other surface of the first insulating layer 22a. Thus, a first board 24 is formed. Then, as shown in FIG. 1C, the first and second metal foil layers 21a and 21b in the first board 24 are formed into predetermined conductor patterns respectively.

A film of a synthetic resin is used as the first insulating layer 22a. Examples of the synthetic resin include a polyimide resin, an acrylic resin, a polyether-nitrile resin, a polyether-sulfone resin, a polyethylene terephthalate resin, a polyethylene naphthalate resin, and polyvinyl chloride resin. Preferably, a film of a polyimide resin is used as the first insulating layer 22a. The thickness of the first insulating layer 22a is generally in a range of from 12.5 to 50 μm and preferably in a range of from 12.5 to 25 μm.

Foil of a metal such as copper, nickel, gold or solder or foil of one of alloys of these metals is used as each of the first and second metal foil layers 21a and 21b. Preferably, copper foil is used. The thickness of each of the first and second metal foil layers 21a and 21b is generally in a range of from 2 to 35 μm and preferably in a range of from 9 to 18 μm.

To laminate the first metal foil layer 21a on one surface of the first insulating layer 22a and the second metal foil layer 21b on the other surface of the first insulating layer 22a, the first and second metal foil layers 21a and 21b, for example, each made of metal foil, may be bonded to the first insulating layer 22a, for example, made of a synthetic resin film, through adhesive agents respectively. Preferably, the first and second metal foil layers 21a and 21b maybe laminated on the first insulating layer 22a directly without interposition of any adhesive agent to thereby form a so-called double-sided substrate.

There is no particular limitation on lamination of the first and second metal foil layers 21a and 21b onto the first insulating layer 22a directly. For example, the lamination may be performed as follows. As shown in FIG. 1A, first, a solution of a synthetic resin is applied uniformly on a surface of the first metal foil layer 21a made of metal foil, and then the solution is dried and heated in accordance with necessity to thereby form the first insulating layer 22a. Then, as shown in FIG. 1B, metal foil is laminated or plated on the other surface (opposite to the surface on which the first metal foil layer 21a is laminated) of the first insulating layer 22a to thereby form the second metal foil layer 21b.

More specifically, the first board 24 may be formed as follows. After a solution of a polyamic acid resin is applied uniformly on a surface of the first metal foil layer 21a made of copper foil, the solution is first dried. After the second metal foil layer 21b made of copper foil is then laminated on the solution, the polyamic acid resin applied thus is heated finally, for example, to 300° C. or higher to be hardened (imidized). Thus, both the first insulating layer 22a of polyimide and the first board 24 can be formed at the same time.

Alternatively, the first board 24 may be formed as follows. After a solution of a polyamic acid resin is applied uniformly on a surface of the first metal foil layer 21a made of copper foil, the solution is, first, dried and hardened (imidized) to thereby form the first insulating layer 22a of polyimide. Then, a surface of the first insulating layer 22a is plated with copper to thereby form the second metal foil layer 21b. Thus, the first board 24 can be formed.

The polyamic acid can be prepared by reaction of acid dianhydride with diamine. Preferred examples of the acid dianhydride include: 3,3', 4,4'-oxydiphthalic dianhydride (ODPA); 3,3', 4,4'-biphenyltetracarboxylic dianhydride; pyromellitic dianhydride; 2,2-bis(3,4-dicarboxyphenyl) hexafluoropropane dianhydride (6FDA); and 3,3', 4,4'-benzophenonetetracarboxylic dianhydride (BTDA). Preferred examples of the diamine include: p-phenylenediamine (PPD); 1,3-bis(3-aminophenoxy) benzene; bisaminopropyltetramethyldisiloxane (APDS); and 4,4'-diaminodiphenyl ether (DDE). The acid dianhydride and the diamine in substantially equimolar proportion are made to react with each other in a suitable organic solvent at room temperature and under atmospheric pressure for a predetermined time, so that the polyamic acid resin can be obtained as a solution of a polyamic acid resin. For example, the organic solvent is a polar solvent such as N-methyl-2-pyrolidone, N,N-dimethylacetamide, N,N-dimethylformamide, or the like. Epoxy resin, bisarylnasic imide, maleimide or the like may be mixed with the polyamic acid resin as occasion demands.

The double-sided substrate in which the first and second metal foil layers 21a and 21b are laminated directly on the first insulating layer 22a is available on the market. Such an article available on the market may be used in this method.

Then, as shown in FIG. 1C, the first and second metal foil layers 21a and 21b in the first board 24 are formed into predetermined conductor patterns respectively.

The first and second metal foil layers 21a and 21b can be formed into predetermined conductor patterns respectively by a known patterning method. Preferably, a subtractive method is used as the patterning method. For example, the subtractive method may be carried out as follows. Etching resists are formed on surfaces of the first and second metal foil layers 21a and 21b so as to correspond to the predetermined conductor patterns respectively. The first and second metal foil layers 21a and 21b are etched while masked with the etching resists respectively. Then, the etching resists are removed.

Then, in this method, a conductive layer 21 and at least one insulating layer 22 are laminated on each other to form a second laminate 25 as a body separate from the first laminate 23, the second laminate 25 having surface layers at least one of which is an insulating layer 22.

Figure 1D:
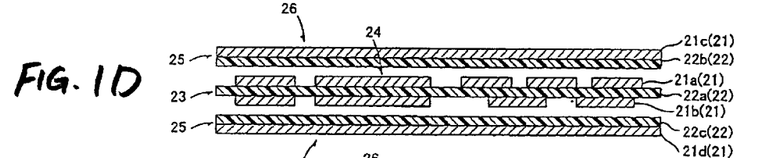
FIG. 1D showing the step of laminating a third metal foil layer on one surface of a second insulating layer and laminating a fourth metal foil layer on one surface of a third insulating layer.

As shown in FIG. 1D, second laminates 25 as defined above are preferably laminated on opposite surfaces of the first laminate 23. Therefore, for example, a second insulating layer 22b is preferably prepared so that a third metal foil layer 21c is laminated on one surface of the second insulating layer 22b to thereby form a second board 26. At the same time, a third insulating layer 22c is preferably prepared so that a fourth metal foil layer 21d is laminated on one surface of the third insulating layer 22c to thereby form a third board 27.

Each of the second and third insulating layers 22b and 22c may be made of the same material as that of the first insulating layer 22a. The thickness of each of the second and third insulating layers 22b and 22c is generally in a range of from 12.5 to 50 μm and preferably in a range of from 12.5 to 25 μm. Similarly, each of the third and fourth metal foil layers 21c and 21d may be made of the same material as those of the first and second metal foil layers 21a and 21b. The thickness of each of the third and fourth metal foil layers 21c and 21d is generally in a range of from 2 to 35 μm and preferably in a range of from 9 to 18 μm.

The third and fourth metal foil layers 21c and 21d can be laminated on one-side surfaces of the second and third insulating layers 22b and 22c respectively as follows. For example, the third and fourth metal foil layers 21c and 21d each made of metal foil may be bonded to the second and third insulating layers 22b and 22c each made of a synthetic resin film, through adhesive agents respectively. Preferably, the third and fourth metal foil layers 21c and 21d maybe laminated directly on the second and third insulating layers 22b and 22c directly without interposition of any adhesive agent to form so-called double-layered substrates respectively.

There is no particular limitation on lamination of the third and fourth metal foil layers 21c and 21d directly onto the second and third insulating layers 22b and 22c respectively. For example, a solution of a synthetic resin may be applied uniformly on respective surfaces of the third and fourth metal foil layers 21c and 21d each made of metal foil. Then, the solution is dried and heated as occasion demands. Thus, the second and third insulating layers 22b and 22c are formed.

More specifically, the second and third boards 26 and 27 can be formed as follows. For example, a solution of a polyamic acid resin is applied uniformly on respective surfaces of the third and fourth metal foil layers 21c and 21d each made of copper foil, in the same manner as described above. Then, the solution is dried and hardened (imidized) so that the second and third insulating layers 22b and 22c each made of polyimide are laminated on the third and fourth metal foil layers 21c and 21d to thereby form the second and third boards 26 and 27.

The double-layered substrate (single-sided substrate) in which the third and fourth metal foil layers 21c and 21d are laminated directly and respectively on the second and third insulating layers 22b and 22c is available on the market. Such an article available on the market may be used in this method.

Then, in this method, the conductive layer 21 forming a surface layer of the first laminate 23 is laminated on the insulating layer 22 forming a surface layer of the second laminate 25.

That is, in the case where second laminates 25 are laminated on opposite surfaces of the first laminate 23 as described above, more specifically, as shown in FIG. 1E, the second insulating layer 22b in the second board 26 is laminated on the first metal foil layer 21a in the first board 24 through a first adhesive layer 28 while the third insulating layer 22c in the third board 27 is laminated on the second metal foil layer 21b in the first board 24 through a second adhesive layer 29.

The first and second adhesive layers 28 and 29 may be formed as follows. Adhesive agents are applied uniformly on the second and third insulating layers 22b and 22c respectively or on the first and second metal foil layers 21a and 21b respectively in advance. Alternatively, adhesive sheets may be put between the second insulating layer 22b and the first metal foil layer 21a and between the third insulating layer 22c and the second metal foil layer 21b to thereby form the first and second adhesive layers 28 and 29 respectively.

Examples of the adhesive agent include: a heat-curable adhesive agent such as a polyimide adhesive agent, an epoxy adhesive agent, an epoxy-nitrile butyl rubber adhesive agent, an epoxy-acrylic rubber adhesive agent, an acrylic adhesive agent, a butyral adhesive agent or an urethane adhesive agent; a thermoplastic adhesive agent such as a synthetic rubber adhesive agent; and an acrylic tackifier such as a pressure-sensitive adhesive agent. Such an adhesive agent formed into a sheet is used as the adhesive sheet. Preferred examples include: a polyimide adhesive agent; an epoxy adhesive agent; an epoxy-nitrile butyl rubber adhesive agent; an epoxy-acrylic rubber adhesive agent; an acrylic adhesive agent; and adhesive sheets of these adhesive agents. The thickness of each of the first and second adhesive layers 28 and 29 is generally in a range of from 5 to 50 $\mu$m and preferably in a range of from 10 to 25 $\mu$m.

There is no particular limitation on lamination through the first and second adhesive layers 28 and 29. For example, crimp may be performed at a temperature of from 100 to 250° C. under pressure of from 0.1 to 20 MPa in the condition that the second insulating layer 22b, the first adhesive layer 28 and the first metal foil layer 21a are piled one upon another and the third insulating layer 22c, the second adhesive layer 29 and the second metal foil layer 21b are piled one upon another.

Further, in this method, in a partial region 30 (which is a region having a smaller number of layers and mainly used as a signal transmission path, which is a portion corresponding to a flexible wiring circuit portion of a related-art rigid flexible wiring circuit board and which will be hereinafter referred to as "thin layer portion") of the second laminates 25, at least the conductive layers 21 laminated on the insulating layers 22 forming surface layers respectively are removed so that the insulating layers 22 forming the surface layers are exposed. At the same time, the residual regions 31 (which are regions each having a larger number of layers and mainly subjected to high-density wiring, which are portions corresponding to rigid wiring circuit portions of the related-art rigid flexible wiring circuit board and which will be hereinafter referred to as "thick layer portions") are formed into predetermined conductor patterns respectively.

That is, in the case where the second insulating layer 22b in the second board 26 is laminated on the first metal foil layer 21a and the third insulating layer 22c in the third board 27 is laminated on the second metal foil layer 21b as described above, as shown in FIG. 1F, the thin layer portion 30 in the third and fourth metal foil layers 21c and 21d in the second and third boards 26 and 27 is removed while the thick layer portions 31 are formed into predetermined conductor patterns respectively.

The removal of the thin layer portion 30 and the formation of the thick layer portions 31 into conductor patterns in the third and fourth metal foil portions 21c and 21d may be performed by a known etching method and may be preferably performed simultaneously by a known patterning method such as a subtractive method as described above.

Figure 1E:
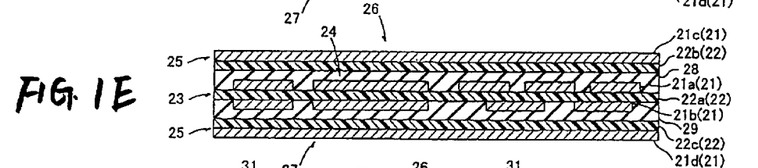
FIG. 1E showing the step of laminating the second insulating layer on the first metal foil layer through a first adhesive layer and laminating the third insulating layer on the second metal foil layer through a second adhesive layer.
Figure 1F:
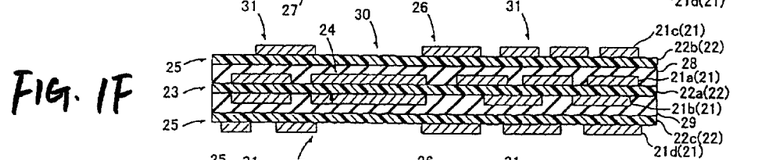
FIG. 1F showing the step of removing a thin layer portion and forming thick layer portions into predetermined conductor patterns respectively in the third and fourth metal foil layers.
Figure 1G:
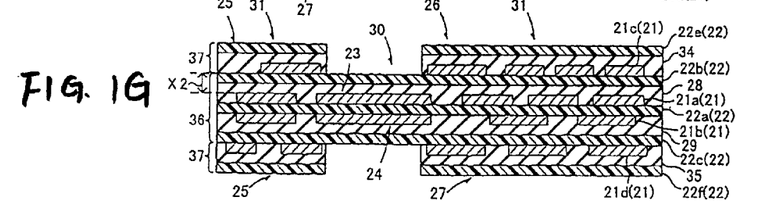
FIG. 1G showing the step of laminating fifth and sixth insulating layers on the thick layer portions of the third and fourth metal foil layers respectively.

Further, in this method, for example, as shown in FIG. 1G, fifth and sixth insulating layers 22e and 22f which serve as cover insulating layers are laminated on the thick layer portions 31 of the third and fourth metal foil layers 21c and 21d formed into predetermined shapes respectively. Thus, a flexible multi-layer wiring circuit board is obtained.

Each of the fifth and sixth insulating layers 22e and 22f may be made of the same material as that of the first insulating layer 22a. The thickness of each of the fifth and sixth insulating layers 22e and 22f is generally in a range of from 12.5 to 50 $\mu$m and preferably in a range of from 12.5 to 25 $\mu$m.

There is no particular limitation on lamination of the fifth and sixth insulating layers 22e and 22f onto the third and fourth metal foil layers 21c and 21d respectively. For example, the fifth insulating layer 22e may be laminated on the third metal foil layer 21c through a third adhesive layer 34 while the sixth insulating layer 22f may be laminated on the fourth metal foil layer 21d through a fourth adhesive layer 35, in the same manner as described above. Each of the third and fourth adhesive layers 34 and 35 may be made of the same material as those of the first and second adhesive layers 28 and 29. The thickness of each of the third and fourth adhesive layers 34 and 35 is generally in a range of from 5 to 50 $\mu$m and preferably in a range of from 10 to 25 $\mu$m.

Though not shown in FIG. 1G, for example, a solution of a synthetic resin may be, first, applied uniformly on respective surfaces of the third and fourth metal foil layers 21c and 21d. Then, the solution is dried and heated in accordance with necessity to form the fifth and sixth insulating layers 22e and 22f. Alternatively, more specifically, for example, after a solution of a polyamic acid resin may be applied uniformly on respective surfaces of the third and fourth metal foil layers 21c and 21d, the solution may be dried and hardened (imidized) to form the fifth and sixth insulating layers 22e and 22f each made of polyimide, in the same manner as described above.

The flexible multi-layer wiring circuit board obtained thus has one first wiring circuit board 36, and two second wiring circuit boards 37. The first wiring circuit board 36 is constituted by a laminate of two conductive layers 21 (first and second metal foil layers 21a and 21b) and three insulating layers 22 (first, second and third insulating layers 22a, 22b and 22c). Each of the second wiring circuit boards 37 is constituted by a laminate of one conductive layer 21 (third or fourth metal foil layer 21c or 21d) and one insulating layer 22 (fifth or sixth insulating layer 22e or 22f). The second wiring circuit boards 37 are provided on the thick layer portions 31 of the first wiring circuit board 36. Thus, the thin layer portion 30 constituted by a part of the first wiring circuit board 36 is formed whereas the thick layer portions 31 constituted by laminated portions of the first and second wiring circuit boards 36 and 37 are formed.

Accordingly, the board obtained thus can be used for the same purpose as that of the related art rigid flexible wiring circuit board shown in FIG. 3B. In the related art rigid flexible wiring circuit board, for example, the insulating portion X1 between the first and third conductive layers 4 and 10 in the rigid wiring circuit portions 1 has the first adhesive layer 15, the second insulating layer 6, the fourth adhesive layer 14 and the fourth insulating layer 9, that is, the number of layers in the insulating portion X1 is four (the number of insulating layers is two). On the contrary, in the flexible multi-layer wiring circuit board shown in FIG. 1G, the insulating portion X2 between the first metal foil layer 21a (the outermost conductive layer 21 of the first wiring circuit board 36) and the third metal foil layer 21c (the nearest conductive layer 21 of the second wiring circuit board 37 to the outermost conductive layer 21) in the thick layer portions 31 has the first adhesive layer 28 and the second insulating layer 22b, that is, the number of layers in the insulating portion X2 is two (the number of insulating layers is one). Accordingly, the number of layers in the insulating portions X2 of each thick layer portion 31 is reduced greatly (to a half) compared with the related-art rigid flexible wiring circuit board. The flexible multi-layer wiring circuit board can sufficiently satisfy the demand for reduction in thickness and weight required in multi-function mobility or the like in recent years. Reduction in the size of apparatus can be achieved.

Moreover, in the flexible multi-layer wiring circuit board, the thickness of each conductive layer 21 is made of thin metal foil with a thickness of from 2 to 35 µm, the thickness of each insulating layer 22 is made of a thin synthetic resin film with a thickness of from 12.5 to 50 µm, and each thick layer portions 31 is formed to be thin. Accordingly, flexibility which cannot be obtained in the related-art rigid flexible wiring circuit board, for example, made of glass-epoxy resin or the like can be exhibited. Hence, installation of the flexible multi-layer wiring circuit board in a narrow space and mounting of it on a movable component can be achieved more easily. The thickness of each of the thick layer portions 31 in the flexible multi-layer wiring circuit board is generally in a range of from 80 to 600 µm and preferably in a range of from 80 to 250 µm and the thickness of the thin layer portion 30 is generally in a range of from 50 to 320 µm and preferably in a range of from 50 to 125 µm.

For example, such a flexible multi-layer wiring circuit board can be obtained also by a method shown in FIGS. 2A to 2G.

Figure 2A:
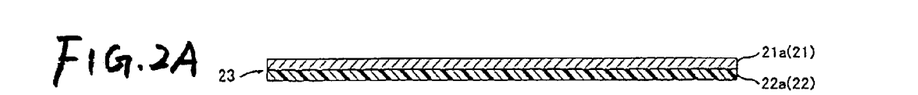
FIG. 2A showing the step of forming a first insulating layer on one surface of a first metal foil layer.
Figure 2B:
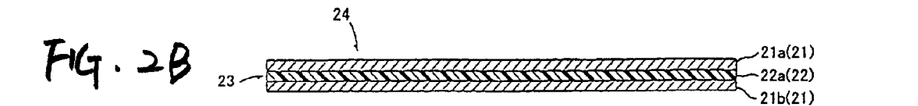
FIG. 2B showing the step of laminating a second metal foil layer on the other surface of the first insulating layer.
Figure 2C:
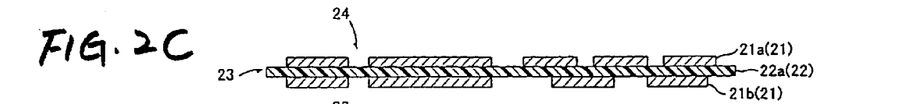
FIG. 2C showing the step of forming the first and second metal foil layers into predetermined conductor patterns respectively.

That is, in the method shown in FIGS. 2A to 2G, a first insulating layer 22a is prepared to form a first laminate 23 as a first board 24 in the same manner as in the method shown in FIGS. 1A to 1G. As shown in FIG. 2A, a first metal foil layer 21a is laminated on one surface of the first insulating layer 22a. As shown in FIG. 2B, a second metal foil layer 21b is laminated on the other surface of the first insulating layer 22a. Thus, the first laminate 23 is formed as the first board 24. Also in the method shown in FIGS. 2A to 2G, the first board 24 is preferably formed as a so-called double-sided substrate in which the first and second metal foil layers 21a and 21b are laminated on the first insulating layer 22a directly. Alternatively, a double-sided substrate available on the market may be used as the first board 24 in the same manner as in the method shown in FIGS. 1A to 1G. Then, as shown in FIG. 2C, the first and second metal foil layers 21a and 21b in the first board 24 are formed into predetermined conductor patterns respectively.

Figures 2D, 2E:
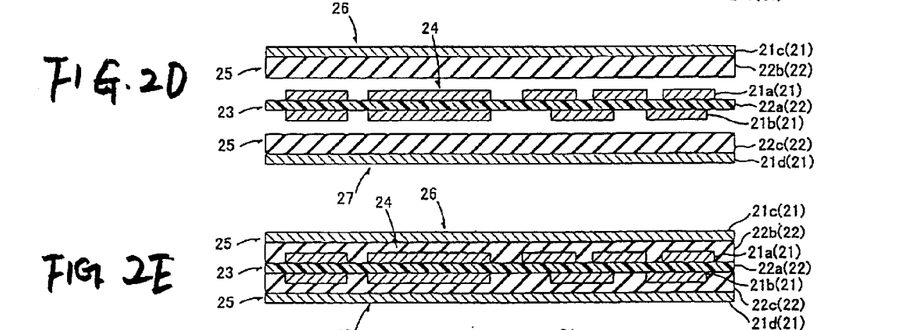
FIG. 2D showing the step of laminating a third metal foil layer on one surface of a second insulating layer serving also as an adhesive layer and laminating a fourth metal foil layer on one surface of a third insulating layer serving also as an adhesive layer.
FIG. 2E showing the step of laminating the second insulating layer serving also as an adhesive layer directly on the first metal foil layer and laminating the third insulating layer serving also as an adhesive layer directly on the second metal foil layer.

Then, in this method, as shown in FIG. 2D, a third metal foil layer 21c is laminated on one surface of a second insulating layer 22b serving also as an adhesive layer to thereby form a second board 26, while a fourth metal foil layer 21d is laminated on one surface of a third insulating layer 22c serving also as an adhesive layer to thereby form a third board 27. Thus, second laminates 25 are formed respectively.

There is no particular limitation on lamination of the third and fourth metal foil layers 21c and 21d onto one-side surfaces of the second and third insulating layers 22b and 22c serving also as adhesive layers respectively. For example, a solution of a synthetic resin having adhesive strength may be applied uniformly on each of the third and fourth metal foil layers 21c and 21d in advance or a synthetic resin sheet having adhesive strength may be stuck to each of the third and fourth metal foil layers 21c and 21d.

The solution of the synthetic resin having adhesive strength or the synthetic resin sheet having adhesive strength may be selected from adhesive agents or adhesive sheets listed above. An adhesive sheet, especially a polyimide adhesive sheet is used preferably. The thickness of each of the second and third insulating layers 22b and 22c serving also as adhesive layers is generally in a range of from 5 to 50 µm and preferably in a range of from 10 to 25 µm.

Then, in this embodiment, as shown in FIG. 2E, the second insulating layer 22b serving also as an adhesive layer for the second board 26 is laminated on the first metal foil layer 21a in the first board 24 directly, while the third insulating layer 22c serving also as an adhesive layer of the third board 27 is laminated on the second metal foil layer 21b of the first board 24 directly. Hence, the second laminates 25 are laminated on the first laminate 23, respectively.

There is no particular limitation on lamination of the second and third insulating layers 22b and 22c serving also as adhesive layers onto the first and second metal foil layers 21a and 21b directly. Crimp may be performed for the lamination in the same manner as in the method described above.

The second and third insulating layers 22b and 22c serving also as adhesive layers may be formed as follows. A solution of a synthetic resin having adhesive strength is applied uniformly on each of the first and second metal foil layers 21a and 21b to thereby form the second and third insulating layers 22b and 22c in advance. The third and fourth metal foil layers 21c and 21d may be laminated on directly the second and third insulating layers 22b and 22c serving also adhesive layers respectively. Alternatively, the second and third insulating layers 22b and 22c serving also as adhesive layers may be prepared as synthetic resin sheets having adhesive strength so that the third and fourth metal foil layers 21c and 21d are laminated on the first and second metal foil layers 21a and 21b respectively while the sheets are disposed between the first metal foil layer 21a and the third metal foil layer 21c and between the second metal foil layer 21b and the fourth metal foil layer 21d respectively. As a result, second laminates 25 are formed and, at the same time, the second laminates 25 are laminated on the first laminate 23.

Figure 2F:
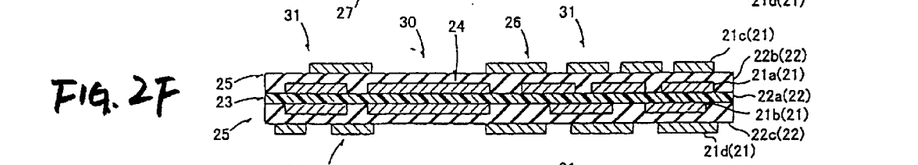
FIG. 2F showing the step of removing a thin layer portion and forming thick layer portions into predetermined conductor patterns respectively in the third and fourth metal foil layers.

Further, as shown in FIG. 2F, a thin layer portion 30 in the third metal foil layer 21c of the second board 26 and the fourth metal foil layer 21d of the third board 27 is removed while thick layer portions are formed into predetermined conductor patterns in the same manner as in the method shown in FIGS. 1A to 1G.

The removal of the thin layer portion 30 and the formation of the thick layer portions 31 into the conductor patterns in the third and fourth metal foil layers 21c and 21d may be performed by a known etching method and preferably performed simultaneously by the known patterning method, more preferably by a subtractive method.

Figure 2G:
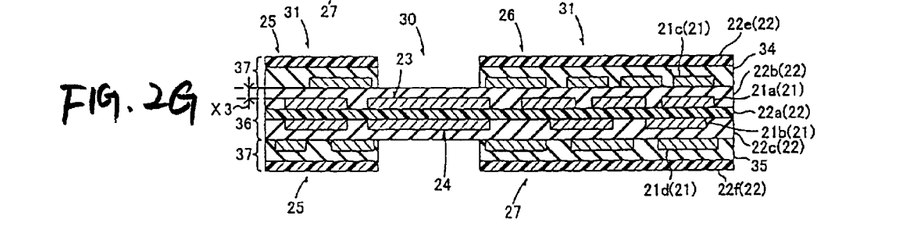
FIG. 2G showing the step of laminating fifth and sixth insulating layers on the thick layer portions of the third and fourth metal foil layers respectively.

Further, as shown in FIG. 2G, fifth and sixth insulating layers 22e and 22f are laminated on the thick layer portions 31 of the third and fourth metal foil layers 21c and 21d formed into predetermined shapes, through third and fourth adhesive layers 34 and 35, respectively, in the same manner as described above. Thus, a flexible multi-layer wiring circuit board is obtained.

In the flexible multi-layer wiring circuit board obtained thus as shown in FIGS. 2A to 2G, for example, the insulating portion X3 between the first and third metal foil layers 21a and 21c in the thick layer portion 31 is constituted by the second insulating layer 22b serving also as an adhesive layer, that is, the number of layers in the insulating portion X3 is only one. Accordingly, the number of layers in the insulating portion X3 in the thick layer portion 31 is reduced more compared with the flexible multi-layer wiring circuit board in which the number of layers in the insulating portion X2 is two as shown in FIGS. 1A to 1G. Hence, the flexible multi-layer wiring circuit board shown in FIGS. 2A to 2G can satisfy more sufficiently the demand for reduction in thickness and weight required in multi-function mobility or the like in recent years. Hence, reduction in apparatus size can be attained more greatly.

Another method than those shown in FIGS. 1A to 1G and FIGS. 2A to 2G may be used as follows. After a first laminate 23 is formed in the same manner as in the method shown in FIGS. 1A to 1G, a second laminate 25 is formed as follows. For example, a solution of a polyamic acid resin is applied uniformly on a surface of the conductive layer 21 in the first laminate 23. Then, the solution is dried and hardened (imidized) to form an insulating layer 22 of polyimide. Then, a surface of the insulating layer 22 is subjected to copper plating or the like so that another conductor pattern 21 having a predetermined conductor pattern is formed by a known method such as a semi-additive method or a subtractive method.

Though not specifically shown in FIGS. 1A to 1G and FIGS. 2A to 2G, opening portions such as veer holes or through-holes are formed suitably in a thickness wise direction in the respective insulating layers 22 (of from the first insulating layer 22a to the sixth insulating layer 22f) in the flexible multi-layer wiring circuit board described above as shown in FIGS. 1A to 1G and FIGS. 2A to 2G. Conducting paths for current conduction between the respective conductive layers 21 (of from the first metal foil layer 21a to the fourth metal foil layer 21d) and terminals to be connected to external terminals are formed in the opening portions. The opening portions may be formed suitably by a known method such as drilling, punching, laser machining, wet etching, or dry etching, in the steps of forming the insulating layers 22 respectively. When a photosensitive synthetic resin, preferably, a photosensitive polyamic acid resin is used, the insulating layers and the opening portions can be formed simultaneously by exposure, development and hardening. Further, such conducting paths and terminals may be formed in the thus formed opening portions by a known method such as plating.

Although the description has been made upon the case where conductive layers 21 and an insulating layer 22 are laminated alternately so that two conductive layers 21 are formed in a first laminate 23, the number of conductive and insulating layers in the first laminate can be selected suitably in accordance with purpose and use in the invention. For example, conductive layers and insulating layers may be laminated alternately so that three or more conductive layers are formed in the first laminate.

Although the description has been made upon the case where one conductive layer 21 and one insulating layer 22 are laminated alternately so that the one conductive layer 21 is formed in a second laminate 25, the number of conductive and insulating layers in the second laminate can be selected suitably in accordance with purpose and use in the invention. For example, conductive layers and insulating layers may be laminated alternately so that two or more conductive layers are formed in the second laminate.

Further, in the invention, the sequence of steps in the producing method is not particularly limited but may be changed suitably. As described above, the method shown in FIGS. 1A to 1G is carried out as follows. First, as shown in FIG. 1E, the second insulating layer 22b of the second board 26 is laminated on the first metal foil layer 21a of the first board 24 through the first adhesive layer 28, while the third insulating layer 22c of the third board 27 is laminated on the second metal foil layer 21b of the first board 24 through the second adhesive layer 29. Then, as shown in FIG. 1F, the thin layer portion 30 in the third and fourth metal foil layers 21c and 21d of the second and third boards 26 and 27 is removed while the thick layer portions 31 are formed into predetermined conductor patterns respectively. Alternatively, for example, first, the thin layer portion 30 in the third and fourth metal foil layers 21c and 21d of the second and third boards 26 and 27 may be removed while the thick layer portions 31 are formed into predetermined conductor patterns respectively. Then, the second insulating layer 22b of the second board 26 is laminated on the first metal foil layer 21a of the first board 24 through the first adhesive layer 28, while the third insulating layer 22c of the third board 27 is laminated on the second metal foil layer 21b of the first board 24 through the second adhesive layer 29.

Further, the fifth and sixth insulating layers 22e and 22f formed as cover insulating layers may be provided as follows. In the same manner as described above, the thin layer portion 30 in the third and fourth metal foil layers 21c and 21d of the second and third boards 26 and 27 is removed while the thick layer portions 31 are formed into predetermined conductor patterns respectively. Then, before the second insulating layer 22b of the second board 26 is laminated on the first metal foil layer 21a of the first board 24 through the first adhesive layer 28, and the third insulating layer 22c of the third board 27 is laminated on the second metal foil layer 21b of the first board 24 through the second adhesive layer 29, the fifth and sixth insulating layers 22e and 22f may be laminated on the thick layer portions 31 of the third and fourth metal foil layers 21c and 21d through the third and fourth adhesive layers 34 and 35 respectively.

Although the description has been made upon the case where the second laminates 25 are laminated on opposite surfaces of the first laminate 23, the invention may be applied also to the case where the first laminate is formed by lamination of only one first metal foil layer on one of opposite surfaces of the first insulating layer and the second laminate is laminated on only one surface of the first laminate to obtain a multi-layer wiring circuit board having the second wiring circuit board on only the one side of the first wiring circuit board.

Further, for the formation of the first laminate and the first board in the invention, as described above, a double-sided substrate in which the first and second metal foil layers 21a and 21b are laminated directly on the first insulating layer 22a and which is available on the market may be used so that the first laminate and the first board is prepared in advance. Also for the formation of the second laminates and the second and third boards in the invention, as described above, two-layered substrates in which the third and fourth metal foil layers 21c and 21d are laminated directly on the second and third insulating layers 22b and 22c respectively and which are available on the market may be used so that the second laminates and the second and third boards are prepared in advance.

Further, in the invention, one insulating layer interposed between the outermost conductive layer and the nearest conductive layer thereto is not an adhesive layer used only for the purpose of bonding a conductive layer and an insulating layer to each other, but means that the number of insulating layers used for electrically insulating conductive layers is one. When the number of such insulating layers is one, the first adhesive layer 28 other than the second insulating layer 22b may be interposed between the first metal foil layer 21a (outermost conductive layer) and the third metal foil layer 21c (nearest conductive layer) in the thick layer portions 31, for example, in the flexible multi-layer wiring circuit board shown in FIGS. 1A to 1G. That is, two layers may be interposed between the conductive layers. Further, the second adhesive layer 29 other than the third insulating layer 22c may be interposed between the second metal foil layer 21b (outermost conductive layer) and the fourth metal foil layer 21d (nearest conductive layer). That is, two layers may be interposed between the conductive layers.

When one insulating layer interposed between the outermost conductive layer and the nearest conductive layer in the invention can serve also as an adhesive layer, that is, when the purpose of insulating the conductive layers from each other and the purpose of bonding the conductive layers to each other can be achieved simultaneously, only one second insulating layer 22b serving also as an adhesive layer may be interposed between the first metal foil layer 21a (outermost conductive layer) and the third metal foil layer 21c (nearest conductive layer) in the thick layer portions 31, for example, as represented by the flexible multi-layer wiring circuit board shown in FIGS. 2A to 2G. Alternatively, only one third insulating layer 22 serving also as an adhesive layer may be interposed between the second metal foil layer 21b (outermost conductive layer) and the fourth metal foil layer (nearest conductive layer).

EXAMPLES

The invention will be described more specifically on the basis of the following Examples and Comparative Examples but the invention is not limited to the Examples and Comparative Examples at all.

Example 1

First, a double-sided copper-clad substrate (ESPANEX SB18-12-18FR made by Nippon Steel Chemical Co., Ltd.) available on the market and constituted by a laminate of 18 μm-thick first and second metal foil layers 21a and 21b each made of copper foil and a 12.5 μm-thick first insulating layer 22a made of polyimide was prepared as a first laminate 23 which was used as a first board 24 (see FIG. 1B).

The first and second metal foil layers 21a and 21b in the first board 24 were formed into predetermined conductor patterns respectively by a subtractive method (see FIG. 1C).

On the other hand, single-sided copper-clad substrates (ESPANEX SB18-12-00FR made by Nippon Steel Chemical Co., Ltd.) constituted by laminates of 18 μm-thick third and fourth metal foil layers 21c and 21d made of copper foil and 12.5 μm-thick second and third insulating layers 22b and 22c made of polyimide were prepared as second and third boards 26 and 27 separately from the first board 24 (see FIG. 1D).

Then, the second insulating layer 22b of the second board 26 was laminated on the first metal foil layer 21a of the first board 24 through a 25 μm-thick first adhesive layer 28 made of an epoxy adhesive agent, and the third insulating layer 22c of the third board 27 was laminated on the second metal foil layer 21b of the first board 24 through a 25 μm-thick second adhesive layer 29 made of an epoxy adhesive agent (see FIG. 1E).

A thin layer portion 30 in the third and fourth metal foil layers 21c and 21d of the second and third boards 26 and 27 was removed and thick layer portions 31 were formed into predetermined conductor patterns respectively by a subtractive method (see FIG. 1F).

Then, 12.5 μm-thick fifth and sixth insulating layers 22e and 22f each made of a polyimide film were laminated on the thick layer portions 31 of the third and fourth metal foil layers 21c and 21d respectively through 15 μm-thick third and fourth adhesive layers 34 and 35 each made of an epoxy adhesive agent to thereby obtain a flexible multi-layer wiring circuit board (see FIG. 1G).

The thickness of the flexible multi-layer wiring circuit board obtained thus in each of the thick layer portions was 210 μm. The thickness in the thin layer portion was 120 μm.

Example 2

First, a double-sided copper-clad substrate (ESPANEX SB18-12-18FR made by Nippon Steel Chemical Co., Ltd.) available on the market and constituted by a laminate of 18 μM-thick first and second metal foil layers 21a and 21b each made of copper foil and a 12.5 μm-thick first insulating layer 22a made of polyimide was prepared as a first laminate 23 which was used as a first board 24 (see FIG. 2B).

The first and second metal foil layers 21a and 21b in the first board 24 were formed into predetermined conductor patterns respectively by a subtractive method (see FIG. 2C)

On the other hand, 25 μm-thick second and third insulating layers 22b and 22c each made of a polyimide adhesive sheet and each serving also as an adhesive layer were laminated (temporarily fixed) on surfaces of 18 μm-thick third and fourth metal foil layers 21c and 21d each made of copper foil at 100° C. to thereby form second and third boards 26 and 27 respectively (see FIG. 2D).

Then, the second insulating layer 22b serving also as an adhesive layer of the second board 26 was crimped by heat onto the first metal foil layer 21a of the first board 24 at 200° C. and the third insulating layer 22c serving also as an adhesive layer of the third board 27 was crimped by heat onto the second metal foil layer 21b of the first board 24 at 200° C. (see FIG. 2E).

A thin layer portion 30 in the third and fourth metal foil layers 21c and 21d of the second and third boards 26 and 27 was removed and thick layer portions 31 were formed into predetermined conductor patterns respectively by a subtractive method (see FIG. 2F).

Then, 12.5 μm-thick fifth and sixth insulating layers 22e and 22f each made of a polyimide film were laminated on the thick layer portions 31 of the third and fourth metal foil layers 21c and 21d respectively through 15 μm-thick third and fourth adhesive layers 34 and 35 each made of a polyimide adhesive agent to thereby obtain a flexible multi-layer wiring circuit board.

The thickness of the thus-obtained flexible multi-layer wiring circuit board in the thick layer portions 31 was 190 μm. The thickness in the thin layer portion 30 was 100 μm.

As described above, in the method of producing a multi-layer wiring circuit board according to the invention, a multi-layer wiring circuit board is formed so that only one insulating layer is interposed between an outermost conductive layer of a first wiring circuit board and a nearest conductive layer of a second wiring circuit board to the outermost conductive layer. Accordingly, the number of layers of the second wiring circuit board in the thick layer portion can be reduced greatly.

Hence, the multi-layer wiring circuit board obtained by the producing method according to the invention can satisfy sufficiently the demand for reduction in weight and thickness required in multi-function mobility or the like in recent years. Hence, reduction in apparatus size can be attained. In addition, good flexibility can be exhibited owing to the reduction in weight and thickness. Hence, installation of the board in a narrow space and mounting of it on a movable component can be achieved more easily.

The present application is based on Japanese Patent Application No. 2001-102896, the entire contents of which are incorporated herein by reference.

What is claimed is:

1. A multi-layer wiring circuit board comprising:
at least one first wiring circuit board made of a laminate of at least one conductive layer and at least one insulating layer; and
at least one second wiring circuit board including at least one conductive layer and laminated on a partial region of said first wiring circuit board;
wherein only one insulating layer is interposed between an outermost conductive layer of said first wiring circuit board and the nearest conductive layer of said second wiring circuit board to said outermost conductive layer,
wherein region of said first wiring circuit board that does not have said second wiring circuit board la mated thereon forms a flexible portion of said multi-layer wiring circuit board.

2. A multi-layer wiring circuit board according to claim 1, wherein said insulating layer interposed between said outermost conductive layer and said nearest conductive layer serves also as an adhesive layer for bonding said outermost conductive layer and said nearest conductive layer to each other.

3. A multi-layer wiring circuit board according to claim 1, wherein said at least one second wiring circuit board is laminated on each of opposite surfaces of said first wiring circuit board.

4. A multi-layer wiring circuit board according to claim 1, wherein said first wiring circuit board includes two conductive layers whereas each second wiring circuit board includes one conductive layer.

5. A multi-layer wiring circuit board as claimed in claim 1, wherein a thickness of the insulating layer between the outermost conductive layer of said first wiring circuit board and the nearest conductive layer of said second wiring circuit board is between 12.5 and 50 micrometers.

6. A multi-layer wiring circuit board as claimed in claim 1, wherein a thickness of the insulating layer between the outermost conductive layer of said first wiring circuit board and the nearest conductive layer of said second wiring circuit board is between 12.5 and 25 micrometers.

7. A multi-layer wiring circuit board as claimed in claim 1, wherein a thickness of at least one of the conductive layers is between 2 and 35 micrometers.

8. A multi-layer wiring circuit board as claimed in claim 1, wherein a thickness of at least one of the conductive layers is between 9 and 18 micrometers.

9. A multi-layer wiring circuit board as claimed in claim 1, wherein the partial region of said first wiring circuit board, onto which said second wiring circuit board is laminated, forms a thick layer portion of the multi-layer wiring circuit board, and a thin layer portion of the multi-layer wiring circuit board is constituted by said flexible portion.

10. A method of producing a multi-layer wiring circuit board, comprising the steps of:
forming a first laminate provided with at least one conductive layer and at least one insulating layer so that at least one of surface layers of said first laminate is a conductive layer;
forming a second laminate provided with at least one conductive layer and at least one insulating layer separately from said first laminate so that at least one of surface layers of said second laminate is an insulating layer;
laminating said conductive layer forming said surface layer of said first laminate on said insulating layer forming said surface layer of said second laminate, wherein said second laminate covers only a portion of said first laminate; and
removing at least said conductive layer of said second laminate laminated on said insulating layer forming said surface layer of said second laminate in a partial region to thereby expose said insulating layer forming said surface layer of said second laminate,
wherein a portion of said first laminate that is not covered by said second laminate forms a flexible portion of said multi-layer wiring circuit board.

11. A method of producing a multi-layer wiring circuit board according to claim 10, wherein said second laminate is laminated on each of opposite surfaces of said first laminate.

12. A method of producing a multi-layer wiring circuit board according to claim 10, wherein said first laminate has two conductive layers whereas each second laminate has one conductive layer.

13. A method as claimed in claim 10, wherein a thickness of the insulating layer forming said surface layer of said second laminate is between 12.5 and 50 micrometers.

14. A method as claimed in claim 10, wherein a thickness of the insulating layer forming said surface layer of said second laminate is between 12.5 and 25 micrometers.

15. A method as claimed in claim 10, wherein a thickness of at least one of the conductive layers is between 2 and 35 micrometers.

16. A method as claimed in claim 10, wherein a thickness of at least one of the conductive layers is between 9 and 18 micrometers.

17. A method of producing a multi-layer wiring circuit board, comprising the steps of:
forming first board by laminating a first metal foil layer on one surface of a first insulating layer and a second metal foil layer on the other surface;
forming said first and second metal foil layers into predetermined conductor patterns respectively;
forming a second board by laminating a third metal foil layer on one surface of a second insulating layer and forming a third board by laminating a fourth metal foil layer on one surface of a third insulating layer;
laminating said second insulating layer of said second board on said first metal foil layer of said first board through a first adhesive layer and laminating said third insulating layer of said third board on said second metal foil layer of said first board through a second adhesive layer, wherein said second and third boards cover only a portion of said first board; and removing a partial region of said third and fourth metal foil layers and forming residual regions except for the removed partial region into predetermined conductor patterns respectively, wherein a portion of the first board which is not covered by said second and third boards forms a flexible portion of said multi-layer wiring circuit board.

18. A method as claimed in claim 17, wherein a thickness of the second or third insulating layer is between 12.5 and 50 micrometers.

19. A method as claimed in claim 17, wherein a thickness of the second or third insulating layer is between 12.5 and 25 micrometers.

20. A method as claimed in claim 17, wherein a thickness of at least one of the metal foil layers is between 2 and 35 micrometers.

21. A method as claimed in claim 17, wherein a thickness of at least one of the metal foil layers is between 9 and 18 micrometers.

22. A method of producing a multi-layer wiring circuit board, comprising the steps of:

forming a first board by laminating a first metal foil layer on one surface of a first insulating layer and a second metal foil layer on the other surface;

forming said first and second metal foil layers into predetermined conductor patterns respectively;

forming a second board by laminating a third metal foil layer on one surface of a second insulating layer serving also as an adhesive layer and forming a third board by laminating a fourth metal foil layer on one surface of a third insulating layer serving also as an adhesive layer;

laminating said second insulating layer serving also as said adhesive layer of said second board onto said first metal foil layer of said first board and laminating said third insulating layer serving also as said adhesive layer of said third board onto said second metal foil layer of said first board, wherein said second and third boards cover only a portion of said first board; and removing a partial region of said third and fourth metal foil layers and forming residual regions except for the removed partial region into predetermined conductor patterns respectively, wherein portion of said first board that is not covered by said second and third boards forms a flexible portion of said multi-layer wiring circuit board.

23. A method as claimed in claim 22, wherein a thickness of the second or third insulating layer is between 12.5 and 50 micrometers.

24. A method as claimed in claim 22, wherein a thickness of the second or third insulating layer is between 12.5 and 25 micrometers.

25. A method as claimed in claim 22, wherein a thickness of at least one of the metal foil layers is between 2 and 35 micrometers.

26. A method as claimed in claim 22, wherein a thickness of at least one of the metal foil layers is between 9 and 18 micrometers.

27. A multi-layer wiring circuit board, comprising:

a first wiring circuit board; and two second wiring circuit boards attached to opposite sides of said first wiring circuit board, wherein said first wiring circuit board is constituted by a laminate of two conductive layers and three insulating layers, wherein each of said two second wiring circuit boards is constituted by a laminate of one conductive layer and one insulating layer, wherein said two second wiring circuit boards are provided on portions of said first wiring circuit board so as to form thick layer portions of said multi-layer wiring circuit board, and remaining portions of said multi-layer wiring circuit board form thin layer portions, and wherein each of said thick layer portions formed by said first and second wiring circuit boards is constituted by four conductive layers and five insulating layers, so that only one insulating layer is provided between each of said conductive layers.

* * * * *